United States Patent [19]

Cervas

[11] Patent Number: 5,359,290
[45] Date of Patent: Oct. 25, 1994

[54] METHOD AND APPARATUS USING A PAIR OF TEST CIRCUITS HAVING LED INDICATORS FOR TESTING ENGINE SENSORS AND IGNITION MODULES IN VEHICLES

[75] Inventor: Robert A. Cervas, Highland Heights, Ohio

[73] Assignee: Actron Manufacturing Company, Cleveland, Ohio

[21] Appl. No.: 2,618

[22] Filed: Jan. 11, 1993

[51] Int. Cl.⁵ .................. G01R 31/02; G01R 19/165; G01R 31/28; F02P 17/00

[52] U.S. Cl. .................................... 324/384; 324/133; 324/537; 324/556

[58] Field of Search .......... 324/73.1, 133, 384, 324/537, 555, 556; 73/117.2

[56] References Cited

U.S. PATENT DOCUMENTS

| | | | |
|---|---|---|---|
| D. 256,580 | 8/1980 | Tichy . | |
| 2,340,765 | 2/1944 | Morch . | |
| 3,028,543 | 4/1962 | Parmater et al. | 324/384 X |
| 3,158,804 | 11/1964 | Weissert | 324/384 |
| 3,210,653 | 10/1965 | Williams et al. . | |
| 3,241,055 | 3/1966 | Knudsen et al. . | |
| 3,300,713 | 1/1967 | Fulton | 324/384 |
| 3,383,592 | 5/1968 | Williamson | 324/384 |
| 3,825,740 | 7/1974 | Friedman et al. . | |
| 3,831,089 | 8/1974 | Pearce | 324/122 |
| 3,956,691 | 5/1976 | Hryhorczuk | 324/384 |
| 4,156,191 | 5/1979 | Knight et al. | 324/202 |
| 4,207,511 | 6/1980 | Radtke . | |
| 4,225,817 | 9/1980 | Kahlden | 324/133 |
| 4,258,305 | 3/1981 | Anglin . | |
| 4,314,383 | 2/1982 | Epstein . | |
| 4,321,522 | 3/1982 | Matsunaga . | |
| 4,327,401 | 4/1982 | Siiberg . | |
| 4,414,698 | 11/1983 | Epstein . | |
| 4,488,112 | 12/1984 | Thompson et al. | 324/202 |
| 4,491,794 | 1/1985 | Daley et al. | 324/158 R |
| 4,498,239 | 2/1985 | Epstein . | |
| 4,514,687 | 4/1985 | Van Husen | 324/158 R |
| 4,521,769 | 6/1985 | Dudeck et al. | 340/635 |
| 4,672,310 | 6/1987 | Sayed | 324/133 |
| 4,673,868 | 6/1987 | Jones, Jr. . | |
| 4,692,697 | 9/1987 | Bray | 324/158 R |
| 4,783,619 | 11/1988 | Herman . | |
| 4,829,248 | 5/1989 | Loubier | 324/202 X |
| 4,845,435 | 7/1989 | Bohan, Jr. | 324/537 |
| 4,868,508 | 9/1989 | Ohishi | 324/525 |
| 4,894,648 | 1/1990 | Talbot . | |
| 4,924,177 | 5/1990 | Mulz | 324/133 |
| 4,947,110 | 8/1990 | Laass | 324/133 |
| 4,983,955 | 1/1991 | Ham, Jr. et al. | 340/664 |
| 4,999,574 | 3/1991 | Stephens | 324/133 |
| 5,032,791 | 7/1991 | Bates, Jr. | 324/202 |
| 5,153,523 | 10/1992 | Samaniego | 324/550 |
| 5,170,125 | 12/1992 | Bates, Jr. | 324/537 |

OTHER PUBLICATIONS

Electronic Ignition Systems 4, Chilton's Guide to Electronic Engine Controls, Copyright 1986, pp. 117–118.
Ford Rotunda Product Specification Sheet (1987) re: Hall effect tester, Model 105-00003.
Ford Rotunda Specification Sheet (1986) re: Model 105-00002.
Thexton New Product Supplement re: Model No. 125 (Jun. 1, 1986).
Thexton Specification Sheet (989) re: Model 128.

*Primary Examiner*—Gerard R. Strecker
*Attorney, Agent, or Firm*—Calfee Halter & Griswold

[57] ABSTRACT

A multi-test, hand-held instrument and method for testing engine sensors and ignition modules includes a housing enclosing a battery and an electrical circuit. The electrical circuit includes a first test circuit electrically interconnected with said battery for testing potentiometer-type, temperature-type and Hall effect type sensors and ignition modules, a second test circuit electrically interconnected with the battery for testing oxygen, reluctance and knock sensors, and a third test circuit for testing the battery in the instrument. A first switch selects between the first or second test circuits, while a second switch selects between a component testing mode and a battery testing mode. Electrical leads extend outwardly from the housing and are connectable to the engine component being tested. A pair of light indicators, with each light indicator including a LED and a resistor connected in parallel, provide a variable output display to allow the test instrument to be used to test various engine sensors and ignition modules, and to test these components on different types of vehicles.

9 Claims, 5 Drawing Sheets

MATCH TO FIG. 2A

METHOD AND APPARATUS USING A PAIR OF TEST CIRCUITS HAVING LED INDICATORS FOR TESTING ENGINE SENSORS AND IGNITION MODULES IN VEHICLES

FIELD OF THE INVENTION

The present invention relates generally to vehicle testing instruments, and in particular to a method and apparatus to test the functioning of certain vehicle components such as engine sensors and ignition modules.

BACKGROUND OF THE INVENTION

Various instruments have been developed to test electrical components in vehicles for operability. Such instruments include voltmeters, ammeters and continuity testers. Some of these instruments have been incorporated into hand-held units such that these tests can be easily performed. One such hand-held instrument is a digital multimeter marketed by the assignee of the present invention under Model 2880. This instrument tests solid state electronics, computer and electronic ignition dwell, electronic and conventional ignition systems, and diodes.

Hand-held instruments have also been developed which have the capability to test certain engine sensors and ignition modules in vehicles. However, it is believed that these instruments are generally limited in their flexibility in testing a wide variety of sensors and/or ignition modules, and in testing these components in different types of vehicles. For example, it is known that hand-held instruments have been developed that test potentiometer-type sensors (e.g., throttle position and EGR position), temperature sensors (e.g., engine coolant, incoming air), Hall effect sensors and/or ignition modules in vehicles; while other hand-held instruments have been developed which have the capability to test oxygen, knock and/or reluctance sensors. In general, potentiometer-type, temperature and Hall effect sensors, and ignition modules, are checked for operability by applying a voltage across the sensor or module, exercising the sensor or module, and observing whether the resistance has changed across the sensor or module. On the other hand, oxygen, knock and reluctance sensors are generally tested by exercising the sensor, and comparing the output voltage of the sensor with a reference voltage. It is believed that these different types of test instruments have been developed heretofore because of the different testing requirements for the engine components.

By way of example, one type of test instrument developed exclusively for Hall effect sensors is shown in Bates, Jr., U.S. Pat. No. 5,032,791. This test instrument apparently provides a visual indication of the operativeness of the Hall effect device when it is coupled to the device. However, the Bates test instrument is limited in its applicability to other types of engine sensors or ignition modules, or even to test the continuity of a circuit. In other words, the Bates test instrument is designed for a specific application and has limited flexibility. To test other vehicle components, for example potentiometer-type and temperature sensors, ignition modules, and oxygen, knock and reluctance sensors, additional instruments or adapters are necessary. However, expense is incurred in having to purchase a multitude of different test instruments or adapters for a vehicle engine. Further, having various test instruments for a vehicle engine can complicate the entire testing process.

Another type of hand-held test instrument is shown in Bates, Jr., U.S. Pat. No. 5,170,125. This test instrument is specifically designed to test the ignition module of a vehicle and to apparently provide a visual indication of the operativeness of this device. However, this instrument also has limited flexibility in being able to test other vehicle components, such as the various engine sensors, and hence suffers from the same drawbacks identified above.

Further, in addition to an instrument's ability to test a variety of engine components, it is important that a test instrument have the capability to test these components on a number of different types of vehicles (e.g., makes, models, etc), for these engine components can be manufactured slightly differently by the various vehicle manufacturers, and hence can have different responses during the testing process. Finally, it is important that such an instrument have protection from circuit overload, incorrect connection, shorts, etc., such that the instrument is not damaged during the tests.

Accordingly, there is a demand in the industry for a single, integral, hand-held instrument which tests a broad range of vehicle components such as various engine sensors and ignition modules, and tests such components on a broad range of vehicles. Further, there is a demand in the industry for a simple and convenient instrument of the above-mentioned type which includes protection from overload, incorrect connection to the vehicle, and shorting, such that the instrument is not damaged through improper use.

SUMMARY OF THE INVENTION

The present invention provides a single, hand-held, integrated test instrument for testing vehicle components. The instrument includes light indicators which provide a unique display of the test results to enable a broad range of engine sensors and ignition modules to be tested, and to test these components on different types of vehicles. Further, the test instrument includes protection circuitry to prevent damage to the instrument through improper use.

The test instrument includes an outer housing enclosing an electrical circuit and a battery. A cover on the housing allows the battery to be removed from a battery compartment and replaced when necessary. Power, signal and ground leads extend outwardly from the electrical circuit in the housing and are connectable to a particular vehicle engine component to be tested, such as an engine sensor or ignition module. Further, the test instrument has additional capabilities, such as the ability to test the continuity of an electrical circuit, diodes or dc voltages on the vehicle.

The electrical circuit for the test instrument includes a first test circuit for potentiometer-type, temperature and Hall effect sensor tests, for ignition module tests, and for diode, dc voltage and continuity tests. The first test circuit indicates the strength of output signals from the sensors using a pair of light indicators, e.g., light emitting diodes (LEDs), with each LED being connected in parallel with a resistor of predetermined value. A first of the two light indicators has a resistor of one value, while the second of the two light indicators has a resistor of a second, lesser value. When a large resistance is connected across the signal and ground leads of the instrument, both light indicators remain inoperative. When the resistance decreases, the first light indicator turns on gradually, followed by the other light indicator. The light indicators cover a large dynamic range of resistance values to enable the first test circuit to be used with different types of engine sensors and with ignition modules, and to test these components on different types of vehicles.

The test instrument further includes a second test circuit for oxygen, knock and reluctance sensors. In the second test circuit, a reference signal is compared to the signal from the sensor being tested to determine whether the sensor signal is above a certain reference voltage. The output from a comparator illuminates the two light indicators when the sensor signal is above the reference signal, indicating an operative sensor, while both light indicators remain inoperative when the sensor signal is below the reference signal, which indicates a defective sensor which should be replaced.

Finally, the test instrument includes a third test circuit for testing the battery in the instrument. The third test circuit is connected to a single light indicator which is illuminated when the battery voltage is of a certain strength. The battery test circuit is used before each test of a vehicle component such that accurate and consistent results are achieved. The first, second and third test circuits are selectively operable when switches on the housing of the instrument are manually activated.

In the test circuits described above, protection means (e.g., resistors and diodes) are used to prevent circuit damage due to incorrect connection of the instrument to voltage sources (e.g., to the vehicle battery) or accidental shorting of the instrument.

The present invention further includes a method for testing potentiometer-type, temperature and Hall effect sensors and ignition modules; as well as oxygen, knock and reluctance sensors, for operativeness. The method includes selectively connecting the power, signal and/or ground leads from the test instrument to the appropriate inputs and/or outputs on the sensor or module, exercising the sensor or module, and observing the light indicators on the instrument to determine whether the sensor or module is operative.

Accordingly, it is one object of the present invention to provide a single, multi-test, hand-held instrument for testing vehicle components such as engine sensors and ignition modules.

It is another object of the present invention to provide a test instrument which tests a broad range of engine components on a number of different types of vehicles, and which is simple and convenient to use.

It is yet another object of the present invention to provide a test instrument for testing various engine components which includes protection circuitry to prevent damage to the instrument from improper use.

It is still another object of the present invention to provide a method for using a hand-held instrument to check engine sensors and ignition modules.

Other objects of the present invention will become further apparent from the following detailed description and drawings which form a part of this specification.

DESCRIPTION OF THE PREFERRED EMBODIMENT

Figure 1:
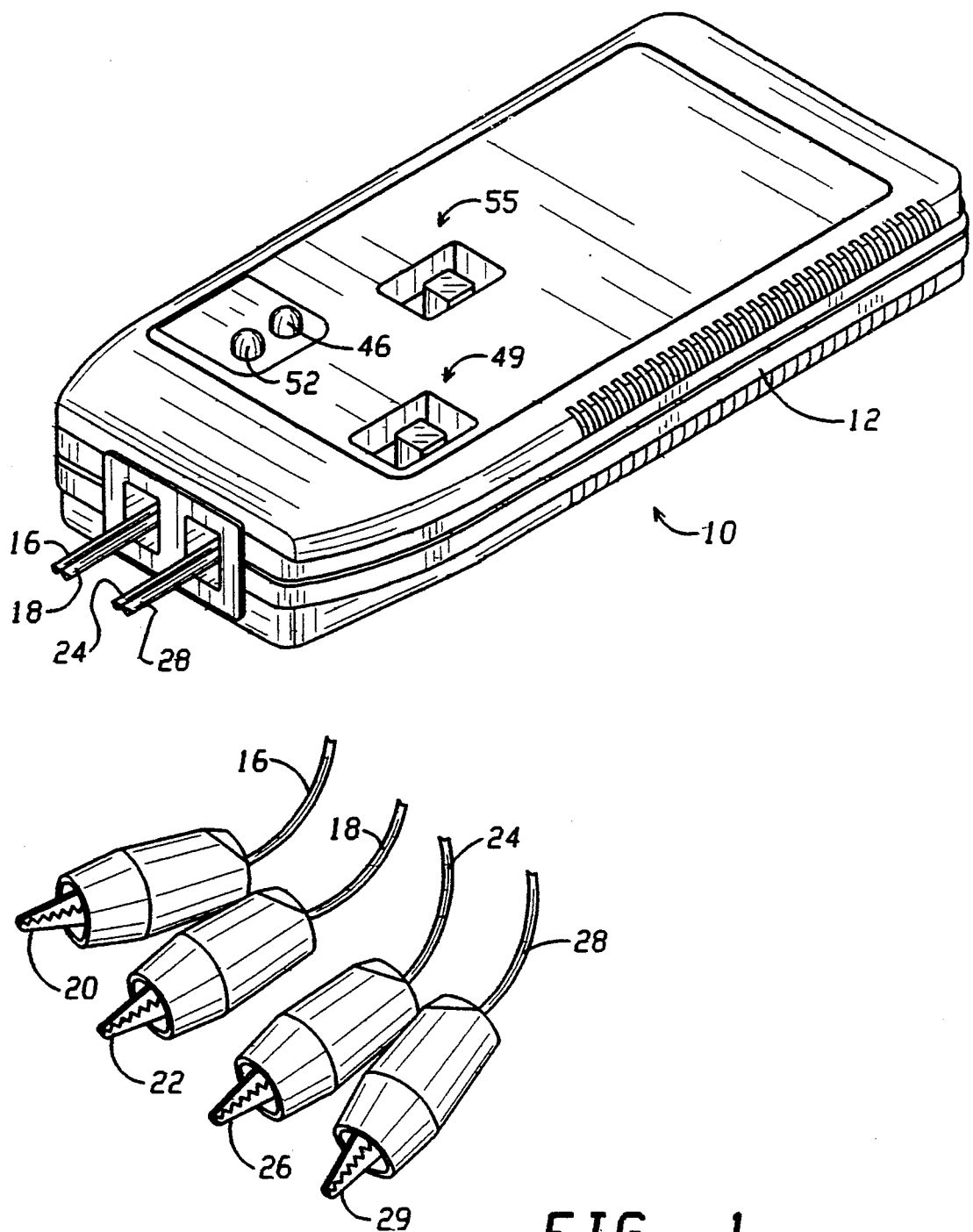
FIG. 1 is a perspective view of the test instrument constructed according to the principles of the present invention.

Referring to the drawings, and initially to FIG. 1, a single, hand-held, test instrument is illustrated generally at 10. The test instrument 10 comprises a housing 12 formed from one or two housing members manufactured from rigid, relatively inexpensive material (e.g., plastic) and secured together as appropriate. A plurality of leads extend outwardly from the housing 12 and are connectable to certain electrical components in the vehicle. In particular, a first set of power leads 16, 18 extend outwardly from the housing 12 and terminate in clips, e.g., alligator clips, 20, 22, respectively, at their distal ends. Further, a ground lead 24 extends outwardly and terminates in alligator clip 26, while a signal lead 28 extends outwardly and terminates in alligator clip 29. The power leads 16, 18, ground lead 24 and signal lead 28 are each connected to a circuit board (not shown) mounted within the housing 12.

Figure 2A:
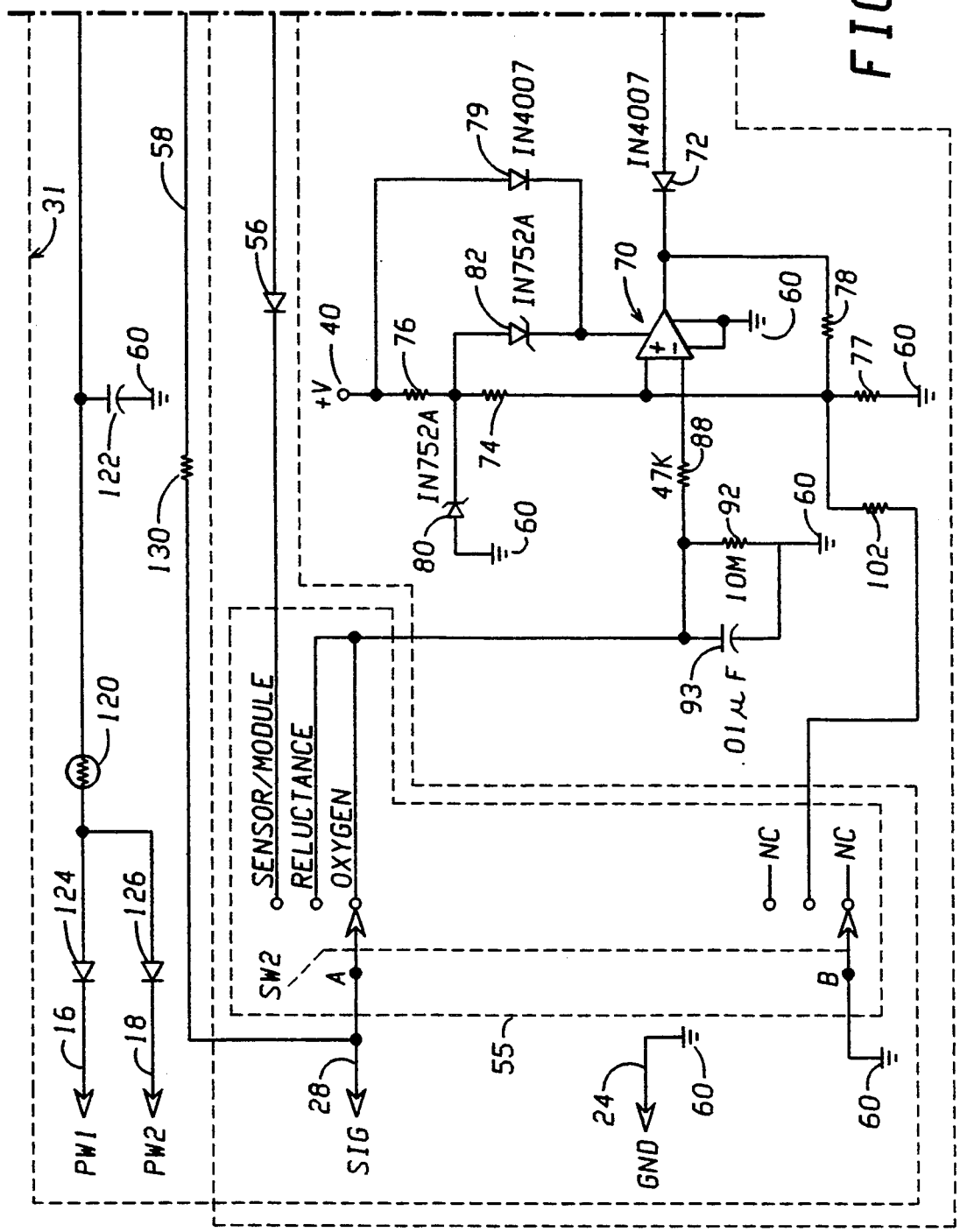
FIGS. 2A and 2B, taken together, are a schematic illustration of the electrical components of the test instrument of FIG. 1.
Figure 2B:
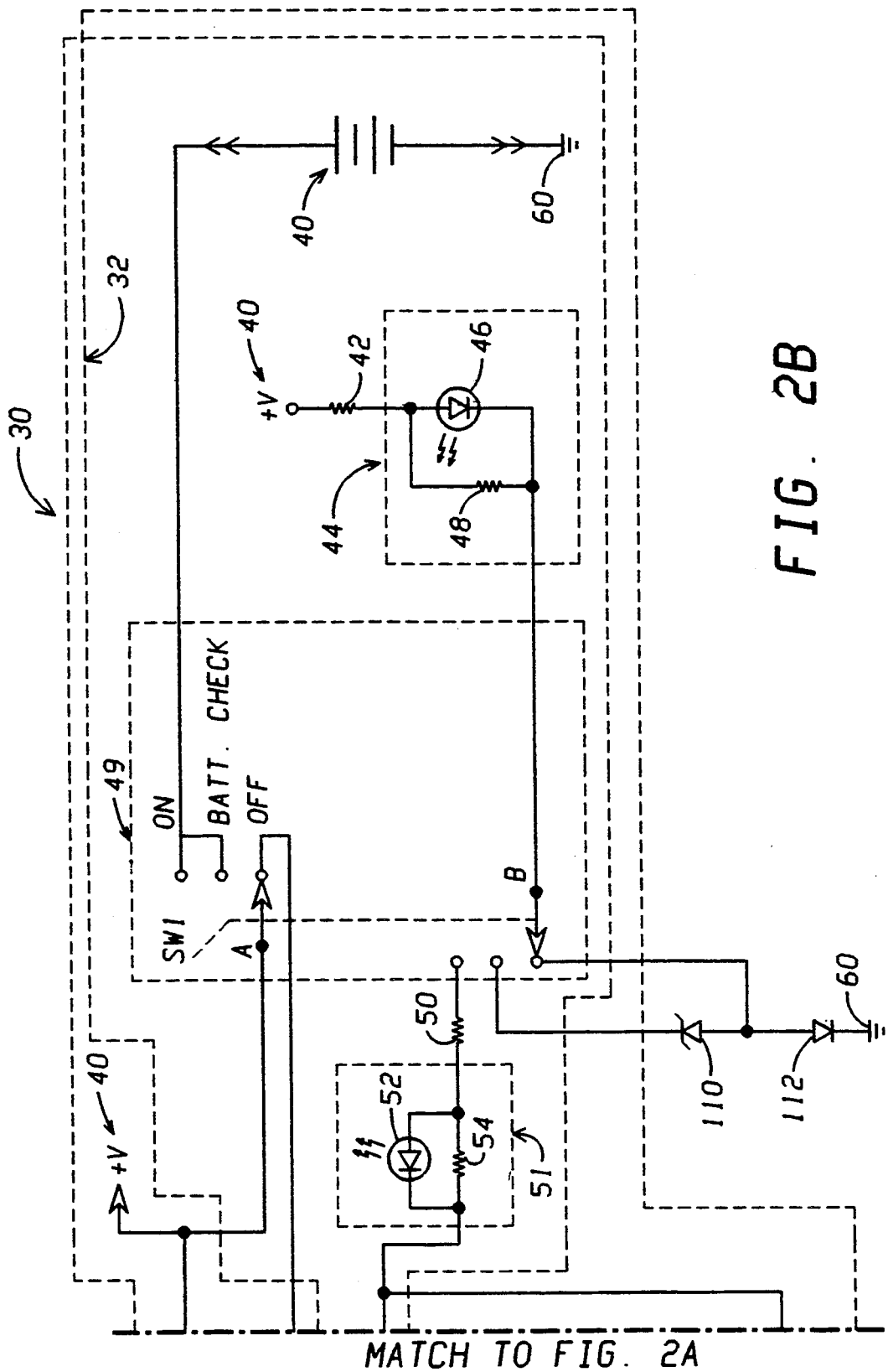
Figure 3:
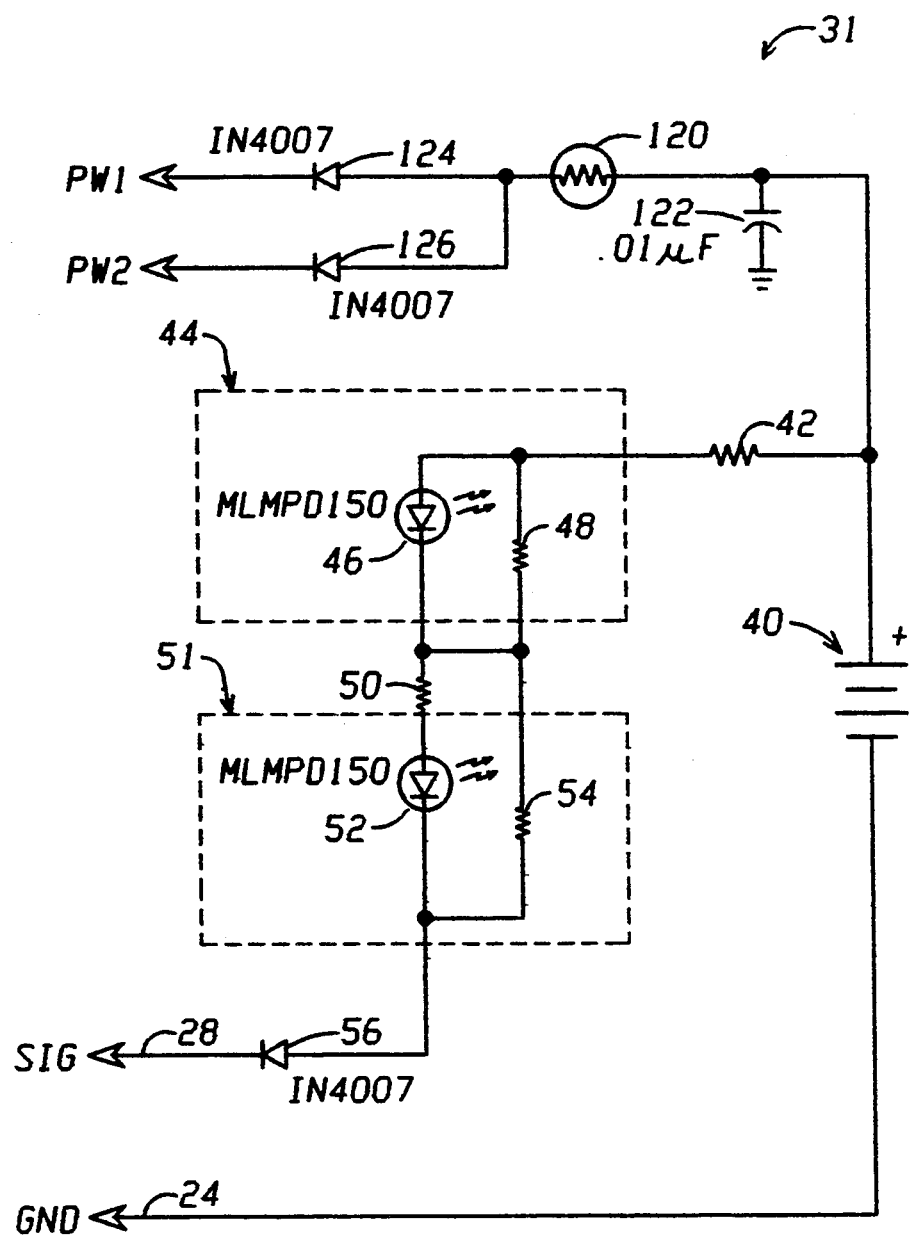
FIG. 3 is a simplified partial schematic illustration of the electrical components for the test instrument showing the test circuit for potentiometer-type, temperature and Hall effect sensors.
Figure 4:
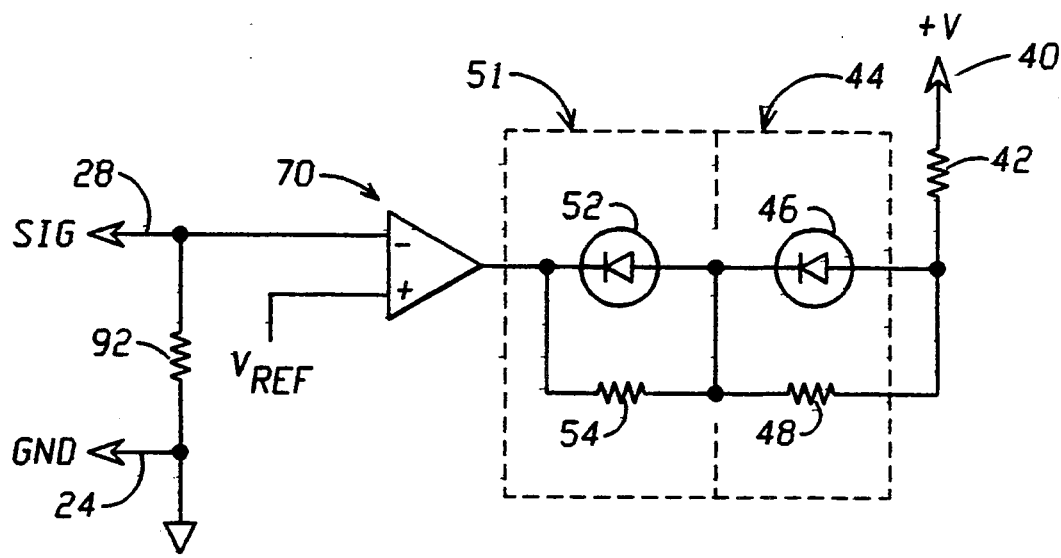
FIG. 4 is a simplified partial schematic illustration of the electrical components for the test instrument showing the test circuit for oxygen, knock and reluctance sensors.
Figure 5:
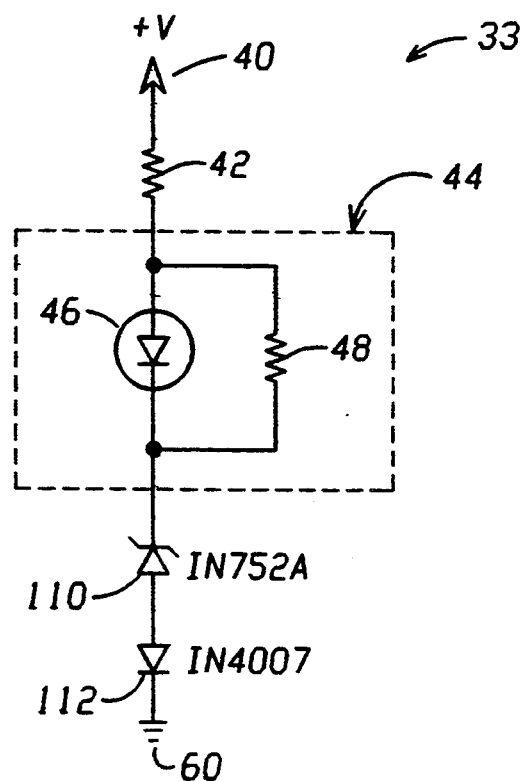
FIG. 5 is a simplified partial schematic illustration of the electrical components for the test instruments showing the battery test circuit of the present invention.

In particular, referring now to FIGS. 2–5, the power leads, ground lead and signal lead terminate at an electrical circuit indicated generally at 30, mounted on the circuit board. FIGS. 2A and 2B illustrate the entire circuit, while FIGS. 3–5 illustrate certain portions of the electrical circuit to be described individually. For example, the electrical circuit 30 includes a first test circuit portion, indicated generally at 31 in FIG. 3, for potentiometer-type, temperature and Hall effect sensors, dc voltage and circuit continuity; a second test circuit portion, indicated generally at 32 in FIG. 4, for oxygen, knock and reluctance sensors; and a third test circuit portion, indicated generally at 33 in FIG. 5, for a battery test. Common reference numerals will be used throughout the figures to identify the same components.

The first test circuit 31 (see, e.g., FIGS. 2A, 2B and 3) includes a power supply 40 connected through resistor 42 (470 ohms) to a first light indicator, indicated generally at 44. Preferably, the power supply 40 comprises a 9 Volt alkaline battery which is enclosed within a battery compartment in the housing. The battery compartment has a removable cover (not shown) to allow ready access and replacement of the battery when necessary. The battery can be connected to the electrical circuit in the housing using a conventional type of connector.

The first light indicator 44 of the circuit preferably comprises a LED 46 and a resistor 48 (8.2K ohms) connected in parallel. The first light indicator 44 is connected through a first switching element, indicated generally at 49, and resistor 50 (470 ohms), to a second light indicator, indicated generally at 51. The second light indicator 51 preferably comprises a second LED 52 and a second resistor 54 (820 ohms) connected in parallel. The first switching element 49 comprises a three-position slide switch (ON/OFF/BATTERY CHECK) which is accessible externally from the housing (see FIG. 1), and allows the user to activate the test instrument so that a test can be performed, or to check the strength of the battery (as will be described herein in more detail).

The second light indicator 51 is connected through a second switching element 55 to the signal lead 28. The second switching element 55 also comprises a three-position slide switch (SENSOR-MODULE/RELUCTANCE/OXYGEN) which is accessible externally from the housing (see FIG. 1), and allows the user to select a particular testing function for a particular vehicle component (as will also be described herein in more detail).

A diode 56 is electrically interposed between the second light indicator 51 and the signal lead 28. The diode 56 protects the circuit from worst case connections to external positive voltage sources. Further, resistors 42 and 50 limit the maximum current through the first and second light indicators 44, 51.

Finally, the first test circuit includes a conductor 58 leading from power source 40 to supply a voltage to power leads 16 and 18; and a ground 60 which is connected to ground lead 24.

As indicated previously, the first test circuit 31 is used to test potentiometer-type, temperature and Hall effect sensors, ignition modules, and diodes, dc voltage and circuit continuity. Each of the potentiometer-type and temperature sensors generally has an internal resistance which provides an output to an on-board computer in the vehicle to indicate whether the engine is functioning properly. By applying a voltage across each sensor, and determining the voltage drop across the sensor, it can be determined whether the sensor is functioning properly.

For example, to test the air temperature sensor of an engine, the sensor is disconnected from the on-board computer, the signal lead 28 of the test instrument is connected to one of the two sensor pins of the air temperature sensor, and the ground lead 24 of the test instrument is connected to the remaining sensor pin. The first switching element 49 is set to the "ON" position and the second switching element is set to the "SENSOR-MODULE" position. The engine is then started, and the LEDS 46 and 52 on the sensor are observed to determine whether the sensor is operating properly. The LEDs 46, 52 of each light indicator are visible externally of the housing 12 (see FIG. 1) such that the operativeness of the air temperature sensor can be easily determined (as will be described herein in more detail).

An engine temperature sensor, potentiometer-type sensor, Hall effect sensor or ignition module is tested in much the same way as the air temperature sensor, as is known to those skilled in the art. For example, to test a Hall effect-type sensor, one power lead of the test instrument (either lead 16 or 18) is connected to the positive input to the Hall effect sensor; the ground lead 24 is connected to the negative input to the sensor; and the signal lead 28 is connected to the signal output ($V_a$) of the Hall effect sensor. At this point, the light indicators should be illuminated. A knife blade or other metal object (e.g., the rotor blade) is then inserted between the permanent magnet and the Hall effect plates in the sensor. If the light indicators extinguish when the metal object is inserted, the Hall effect sensor is operative.

Similarly, to test an ignition module of a vehicle, one power lead (either lead 16 or 18) is connected to the positive input of the module; the ground lead 24 is connected to the ground input of the module; the signal lead 28 is connected to the ignition coil primary output of the module; and the clip of the other power lead (either lead 16 or 18) is touched to the timing signal input of the module. If the light indicators illuminate when this power lead touches the timing signal input, the module is operative.

The test instrument can be set such that one or both of the LEDs are either dimly or brightly lit to indicate sensor or ignition module operativeness. In particular, when small currents flow, resistor 54 and resistor 48 shunt current around the LEDs 46, 52 and neither LED is illuminated. However, increasing the current makes the voltage rise across resistor 48 until the turn-on threshold of LED 46 is reached and LED 46 begins to illuminate. At this point, LED 52 remains off because resistor 54 has a lower value than resistor 48, and the voltage across resistor 54 is too low to illuminate LED 52. Further, resistor 48 serves to shunt current away from LED 46 so that the brightness of this LED increases more gradually than if all the current were flowing through LED 46 alone. Eventually, an increasing current flow reaches a point where the voltage drop across resistor 54 is high enough to illuminate LED 52.

Using these principles, the value of resistors 48, 54 can be chosen such that the first circuit is capable of testing a wide range of sensors and ignition modules on different types of vehicles. For example, with the resistor values indicated previously, the light indicators can test resistance levels from about 500 ohms to about 25K ohms. These resistance levels have been found appropriate to test most engine sensors and ignition modules in various makes of cars, e.g., GM, Ford and Chrysler.

Using the resistance values indicated above for GM cars, both light indicators on the test instrument will be brightly illuminated for a correctly-functioning air temperature sensor after the engine is warmed up. However, for Ford vehicles, which have sensors with different resistance values thereacross, only one light indicator (light indicator 44) will be illuminated for a correctly-functioning air temperature sensor. Similarly, for a Chrysler vehicle, which also has sensors with different resistor values thereacross, the first light indicator 44 will be brightly illuminated, while the second light indicator 51 will be dimly illuminated for a correctly-functioning air temperature sensor.

Similar display results are found for other types of sensors and for ignition modules. In particular, when the test instrument is connected across two sensor outputs or two or more ignition module outputs, and the sensor or module is exercised, the light indicators provide a visual indication of whether the sensor or module is operative. Moreover, as described above, since the light indicators have a broad dynamic range, the test instrument can be used for sensors and ignition modules on a wide variety of vehicles. Appropriate instruction manuals can be provided along with the test instrument to describe the results anticipated for different engine sensors and ignition modules and for different types of vehicles when the vehicle components are operating properly.

The second test circuit 32 for the oxygen, knock and reluctance sensors (see, e.g., FIGS. 2A, 2B, 4) will now be briefly described. The test circuit 32 also includes power supply 40 which is connected through resistor 42 and light indicators 44 and 51 as described previously. The light indicator 51 is connected to the output (pin 6) of a comparator 70 (TLC271) through diode 72. The positive input (pin 3) of comparator 70 is connected through resistor 74 (105K) and resistor 76 (4.7K) to power supply 40, and through resistor 77 (102K) to ground 60. Output resistor 78 (3 Meg) is connected between the positive input and the output of the comparator 70; while pins 4 and 8 of the comparator are connected to ground. Resistors 74, 76 and 77 provide a DC reference voltage at the positive input of comparator 70. Diode 79, zener diode 80 and zener diode 82 are also connected between power supply 40 and the comparator 70, and between ground 60 and comparator 70, to clamp the voltage to comparator 70 at a safe level and protect the circuit from worst case connections to external voltage sources.

The negative output of the comparator (pin 2) is connected to the signal lead 28 through resistor 88 when the first switch element 49 is in the "ON" position and the second switch element 55 is in the "OXYGEN" position. Resistor 88 also protects the comparator from damaging fault currents which could flow if a high voltage were accidentally applied to the circuit. Resistor 92 sets the circuit input impedance to a high value to avoid disturbing the sensor signal on signal lead 28. Further, capacitor 93 filters out electrical noise which may be induced across resistor 92. The output voltage signal swing from comparator is preferably above and below the reference voltage level at the positive input of the comparator, such that the light indicators 44, 51 are both inoperative when the sensor signal is less than the reference voltage, and are both illuminated when the sensor signal is above the reference voltage.

Since the resistance necessary to test reluctance type and knock sensors is slightly different than the resistance necessary to test oxygen sensors, a resistor 102 (8.2 k) is incorporated into the second test circuit to change the reference voltage value when the second switch element 55 is set in the "RELUCTANCE" position.

As described previously, the second test circuit described above tests oxygen, reluctance and knock type sensors. For example, to test reluctance, the switch element 55 is set to the "RELUCTANCE" position, and the signal test lead 28 is connected to a sensor coil pin on the disconnected reluctance sensor. The ground lead 24 is then connected to the remaining sensor coil pin. The reluctor ring is then rotated, and the light indicators 46, 52 are observed to determine whether they are illuminated. A properly functioning reluctance circuit flashes both light indicators on and off. If both light indicators remain constantly on or constantly off, the sensor is defective and must be replaced.

To test oxygen sensors, the second switch element is set to "OXYGEN" the signal lead 28 is connected to one wire from the disconnected sensor, and the ground lead 24 is either connected to another wire from the sensor or to the sensor housing, depending upon the type of oxygen sensor being tested. After the engine has warmed up, both light indicators should be steadily illuminated, both light indicators should flash intermittently, or both light indicators should briefly flash after the engine is momentarily accelerated, to indicate a correctly functioning oxygen sensor.

Finally, to test knock sensors, the second switch element is again set to "RELUCTANCE", the signal lead 28 is connected to the top signal pin of the disconnected sensor, and the ground lead 24 is connected to the body of the sensor, to ground, or to the remaining sensor pin on the sensor, depending upon the type of knock sensor being tested. A mounting surface near the sensor is then tapped, and the light indicators are observed for illumination. If the light indicators illuminate when the mounting surface is tapped, the sensor is functioning properly.

The third test circuit 33 for the battery check is illustrated in FIGS. 2A, 2B and 5. When the first switching element 49 is set to "BATTERY CHECK" (regardless of what the second switching element 55 is set at), the voltage from power source 40 is applied through light indicator 44 and across zener diode 110 and diode 112. Diode 112 protects the circuit against worst case connections to external positive voltage sources. As long as the battery voltage is high enough to forward bias LED 46 and cause zener diode 110 to avalanche, LED 46 will illuminate. The component values of the zener diode 110 and resistor 48 are chosen such that LED 46 is off when the battery voltage is too low for reliable testing. As indicated previously, the battery should be checked before any of the tests of the vehicle components are performed, such that accurate and consistent testing results are achieved.

Finally, other protection circuitry is associated with power leads 16 and 18. For example, a positive temperature coefficient thermistor 120 is provided along power conductor 58 to limit current flow should either power lead 16, 18 accidentally short to ground. Further, capacitor 122 filters noise which may be on the applied voltage along power lead 58. Further, diodes 124, 126 along power leads 16, 18, respectively, also protect the circuit against incorrect connection of the power leads.

Finally, when the testing is complete, the first switching element 49 is moved to the "OFF" position and the test instrument can be stored away.

Accordingly, as described above, the present invention provides a novel and unique hand-held test instrument which can be used to test a variety of engine sensors and ignition modules, and to test these vehicle components on different types of vehicles. The test instrument is simple and convenient to use and includes protection circuitry to prevent damage to the instrument in the event of improper use.

The principles, preferred embodiments and modes of operation of the present invention have been described in the foregoing specification. The invention which is intended to be protected herein should not, however, be construed as limited to the particular form described as it is to be regarded as illustrative rather than restrictive. Variations and changes may be made by those skilled in the art without departing from the spirit of the present invention.

For example, it should be apparent that the test instrument of the present invention can be used for other electrical tests in the vehicle, such as testing the continuity of a circuit, checking diodes, or for detecting dc voltages in a circuit. To test the dc voltages in a circuit, positive voltages applied between signal lead 28 and ground lead 24 cause light indicator 44 to illuminate, with the brightness of the LED increasing as the applied voltage increases. For this type of test, first switching element 49 is set to the "OFF" position, and external voltage passes through resistor 130 (3.3K) and ends up on the circuit power connection point. LED 44 is connected to ground 60 through diode 112 when switching element 49 is in the "OFF" position. As the external voltage increases, more voltage appears at LED 44, causing this LED to illuminate.

Accordingly, the foregoing detailed description should be exemplary in nature and not as limiting to the scope and spirit of the invention set forth in the following claims.

What is claimed is:

1. A multi-test, hand-held instrument for testing engine sensors and ignition modules, comprising:

a housing enclosing an electrical circuit, said electrical circuit including (i) a first test circuit for testing potentiometer-type, temperature-type and Hall effect type sensors and ignition modules, (ii) a second test circuit including at least a portion of said first test circuit and electrically interconnected with said at least a portion of said first test circuit by means of a first switch, said second testing circuit for testing oxygen, reluctance, and knock sensors, (iii) electrical leads including a signal lead and a ground lead connectable to an oxygen, reluctance, air temperature or knock sensor or module being tested, and further including at least one power lead connectable to Hall effect sensors or ignition modules being tested and (iv) a power source electrically connected to said first and second test circuits for providing electrical current thereto, said first or second test circuit including at least one indicator circuit responsive to electrical current provided by said power source and passing therethrough to visually display an indication of the operability of the sensor or ignition module being tested when said electrical leads are connected to the sensor or ignition module and said first switch is set appropriately, wherein said at least one indicator circuit comprises a light emitting diode (LED) connected electrically in parallel with a corresponding resistor.

2. An instrument as in claim 1, wherein said at least one indicator circuit comprises two indicator circuits connected electrically in series with each other and with said first and second test circuits, each of said indicator circuits comprising a light emitting diode (LED) connected electrically in parallel with a corresponding resistor.

3. An instrument as in claim 2, wherein said at least one power lead comprises a pair of power leads for supplying a voltage from said power source to the engine sensor or ignition module being tested.

4. An instrument as in claim 3, wherein said second test circuit includes circuitry for comparing an input signal received on said signal lead from an oxygen or reluctance sensor with a predetermined reference voltage.

5. An instrument as in claim 2, further including circuitry to protect said electrical circuit from voltage overload and shorts from incorrect connections of said power, signal and ground leads to an engine sensor or ignition module.

6. An instrument as in claim 2, wherein said electrical circuit further includes a third test circuit for testing said power source, and a second switch for disabling said second test circuit and a portion of said first test circuit, wherein one of said indicator circuits provides a visual indication of the strength of said power source when said second switch is set appropriately.

7. An instrument as in claim 2, wherein said second test circuit includes resistance circuitry for testing reluctance and knock sensors, said resistance circuitry not being used for testing oxygen sensors, and wherein said first switch selects said resistance circuitry when testing reluctance and knock sensors.

8. A method for testing engine sensors and ignition modules, comprising the steps of:

supplying a hand-held testing device electrically connectable to the engine sensor and the ignition module to be tested, said hand-held testing device including:

i) a housing enclosing a battery and an electrical circuit, said electrical circuit including a first test circuit electrically interconnected with said battery for testing potentiometer-type, temperature-type and Hall effect type sensors and ignition modules, a second test circuit including at least a portion of said first test circuit and electrically interconnected with said at least a portion of said first test circuit and said battery by means of a first switch, said second testing circuit for testing oxygen, reluctance and knock sensors, (ii) electrical leads including a signal lead and a ground lead connectable to an oxygen, reluctance, air temperature or knock sensor or module being tested, and further including at least one power lead connectable to a Hall effect sensor or ignition module being tested, said first or second test circuit including two indicator circuits responsive to electrical current provided by said battery and passing therethrough to visually display an indication of the operability of the sensor or ignition module being tested when said electrical leads are connected to the sensor or ignition module and said first switch is set appropriately, wherein each of said two indicator circuits comprises a light emitting diode (LED) connected electrically in parallel with a corresponding resistor;

connecting the electrical leads to an engine sensor or ignition module, manipulating said first switch such that the appropriate test circuit is electrically connected to the engine sensor or ignition module being tested, and exercising the engine sensor or ignition module, and observing said LEDs to determine whether the engine sensor or ignition module is operable, said LEDs being selectively illuminated depending upon the type of engine sensor or ignition module undergoing the test.

9. A method as in claim 8, further including the step of initially checking the strength of said battery in the instrument by selectively actuating a battery test switch incorporated into the instrument.

* * * * *